US012672366B2

(12) United States Patent
 Astratov et al.

(10) Patent No.: US 12,672,366 B2
(45) Date of Patent: Jun. 30, 2026

(54) PHOTODETECTOR FOCAL PLANE ARRAYS WITH ENHANCED DETECTION CAPABILITY

(71) Applicant: Government of the United States, as represented by the Secretary of the Air Force, Wright-Patterson AFB, OH (US)

(72) Inventors: Vasily Astratov, Charlotte, NC (US);
 Grant Bidney, Charlotte, NC (US);
 Igor Anisimov, Oakwood, OH (US);
 Joshua Duran, Dayton, OH (US);
 Gamini Ariyawansa, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 387 days.

(21) Appl. No.: 18/410,080

(22) Filed: Jan. 11, 2024

(65) Prior Publication Data

US 2024/0243158 A1     Jul. 18, 2024

Related U.S. Application Data

(60) Provisional application No. 63/439,613, filed on Jan. 18, 2023.

(51) Int. Cl.
 *H10F 39/18* (2025.01)
 *H10F 30/227* (2025.01)
 *H10F 39/00* (2025.01)
(52) U.S. Cl.
 CPC ......... *H10F 39/184* (2025.01); *H10F 30/227* (2025.01); *H10F 39/806* (2025.01); *H10F 39/8067* (2025.01)

(58) Field of Classification Search
 CPC ....... H10F 30/227; H10F 39/184–1847; H10F 39/806; H10F 39/8067
 See application file for complete search history.

(56) References Cited

U.S. PATENT DOCUMENTS

| | | | |
|---|---|---|---|
| 9,362,324 B1 | 6/2016 | Astratov et al. | |
| 10,585,238 B2 | 3/2020 | Astratov et al. | |
| 2014/0263982 A1* | 9/2014 | Shkunov | G02B 3/0056 216/26 |

OTHER PUBLICATIONS

B. Desiatov, et al., Plasmonic enhanced silicon pyramids for internal photoemission Schottky detectors in the near-infrared regime, Optica, vol. 2, No. 4, pp. 335-339, published by the Optical Society of America, Apr. 2015.

(Continued)

*Primary Examiner* — Daniel P Shook
(74) *Attorney, Agent, or Firm* — AFMCLO/JAZ; Jeffrey V. Bamber

(57) ABSTRACT

A photodetector focal plane array (FPA) with enhanced detection capability and reduced thermal current is provided. The FPA includes light-concentrating dielectric structures in a form of arrays of elements with three-dimensional geometrical shapes. The elements have tapered sidewalls that taper inwardly toward a surface portion with a reduced width. A photodetector is joined to the portion with a reduced width. A metallic layer is disposed over the tapered sidewalls of the elements and the portion of the surface of the elements with a reduced width. The metallic layer provides mirror reflection properties to concentrate electromagnetic fields towards the detectors. The photodetector focal plane array may be used for infrared (IR) imaging applications in mid-wave IR (MWIR) and long-wave IR (LWIR) cameras as night vision and thermal imaging devices.

9 Claims, 7 Drawing Sheets

(56) References Cited

OTHER PUBLICATIONS

H.-J. Syu, et al., Ultra-broadband photoresponse of localized surface plasmon resonance from Si-based pyramid structures, Photonics Research, vol. 7, No. 10, pp. 1119-1126, Sep. 2019.

B. Jin, et al., Microconical silicon mid-IR concentrators: Spectral, angular and polarization response, Optics Express vol. 28, No. 19, pp. 27615-27627, published by the Optical Society of America, Sep. 14, 2020.

G.W. Bidney, et al., "Photodetector Focal Plane Arrays Integrated with Silicon Micropyramidal Structures in MWIR," Proc. of Government Microcircuits Applications & Critical Technologies (GOMACTech), San Diego, Mar. 20-23, 2023, https://doi.org/10.48550/arXiv.2309.15077.

G.W. Bidney, et al., "Focusing and Diffraction of Light by Periodic Si Micropyramidal Arrays," Proc. of Government Microcircuits Applications & Critical Technologies (GOMACTech), San Diego, Mar. 20-23, 2023.

G.W. Bidney, et al., "MWIR Photodetector Arrays Enhanced by Integration with Si Micropyramidal Structures," 2023 IEEE Research and Applications of Photonics in Defense Conference (RAPID), Miramar Beach, FL, USA, Sep. 11-13, 2023, pp. 1-2, https://doi: 10.1109/RAPID54473.2023.10264769.

G.W Bidney, et al., "Light Manipulation with Si Mesoscale Structures for Applications in IR Photodetector and Photoemitter Arrays," 2023 IEEE Research and Applications of Photonics in Defense Conference (RAPID), Miramar Beach, FL, USA, Sep. 11-13, 2023, pp. 1-2, https://doi: 10.1109/RAPID54473.2023.10264719.

* cited by examiner

PHOTODETECTOR FOCAL PLANE ARRAYS WITH ENHANCED DETECTION CAPABILITY

Pursuant to 37 C.F.R. § 1.78(a)(4), this application claims the benefit of and priority to prior filed Provisional Application Ser. No. 63/439,613, filed Jan. 18, 2023, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to optical components and, more particularly, to photodetectors and photodetector focal plane arrays (FPAs). The present invention also relates to imaging systems such as MWIR and LWIR cameras.

BACKGROUND OF THE INVENTION

Mid-wave IR (MWIR) and long-wave IR (LWIR) cameras are widely used as night vision and thermal imaging devices. The key component of such cameras is the photodetector focal plane array (FPA) where the intensity distribution is detected on a plane by an array of detectors connected to a readout optical integrated circuit (ROIC). Currently, high-quality MWIR and LWIR cameras require cryogenic cooling which increase the weight, size, and cost of such systems. On the other hand, imaging by uncooled (or thermoelectrically cooled) cameras suffer from the large level of thermal noise. The thermal noise can be reduced by reducing the size of individual photodetectors in the FPA, but this is associated with a loss of the optical signal.

Recently, it was proposed that micropyramidal arrays, which can be fabricated by anisotropic wet etching of Si, can be used to increase the efficiency of collection of photons on compact photodetectors. Such proposed devices provide the ability to implement sophisticated readout circuits for both photon detection and electronic readout on a silicon chip. However, Si is an indirect semiconductor, and it is an inefficient absorber in the MW M and LWIR regimes. For this reason, such proposals have not been realized in real practical applications in MWIR and LWIR cameras to date.

Commercial microlens arrays can concentrate light, but they cannot increase the quantum yield and they have very limited angle-of-view. The same limitations apply to integrated microlenses, metalenses, or dielectric microdisk antenna arrays. Spectral response of individual pixels can be enhanced by using surface plasmonic gratings, nanoparticles, nanoantennas, subwavelength hole arrays, microstructures surfaces, and photonic crystals. These techniques enhance the absorptivity of the pixels, however, they are missing light concentrating capability and operate over a narrow spectral bandwidth.

Therefore, the search for improved optical components and, more particularly, for improved photodetector focal plane arrays has continued.

SUMMARY OF THE INVENTION

The present invention relates generally to optical components and, more particularly, to a photodetector and photodetector focal plane arrays (FPAs). The present invention also relates to the inclusion of the same in imaging systems such as MWIR and LWIR cameras.

While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a photodetector focal plane array (FPA) is provided. The photodetector focal plane array (FPA) comprises:

a) photodetectors that are photosensitive in the IR region of the electromagnetic spectrum;

b) light-concentrating dielectric structures in a form of arrays comprising elements with three-dimensional geometrical shapes, wherein the elements have a first surface, a second surface, and tapered sidewalls that taper inwardly to a portion of the second surface that has a reduced width, wherein a photodetector is joined to the portion that has a reduced width; and c) a metallic layer that is disposed over the tapered sidewalls of the elements and the portion of the surface of the elements that has a reduced width, wherein the metallic layer serves one of the following functions: concentrates plasmonic fields towards the detectors, or provides mirror reflection properties to concentrate electromagnetic fields towards the detectors.

A method is also provided for concentrating IR radiation in a dielectric structure. The method may utilize a photodetector focal plane array (FPA) that comprises any of the light-concentrating dielectric structures described herein. The method comprises: providing a tapered dielectric structure with side walls and a smaller closed surface wherein the side walls and the smaller closed surface are mirrored to reflect at least some of the IR radiation into the interior of the structure; and directing radiation into the interior of the tapered structure wherein at least some of the radiation reflects off at least one of the surfaces of the tapered side walls toward another surface of the tapered side walls. The method may increase the pathlength and, hence, absorption and quantum yield of the dielectric structure.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 8I is a microscope photograph showing a fifth step in the fabrication of the PtSi Schottky photodetector arrays from the top.

FIG. 8J is a schematic side view showing the fifth step in the fabrication of the PtSi Schottky photodetector arrays.

FIG. 8K is a microscope photograph showing a sixth step in the fabrication of the PtSi Schottky photodetector arrays from the top.

FIG. 8L is a schematic side view showing the sixth step in the fabrication of the PtSi Schottky photodetector arrays.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and used environment. Certain features of the illustrated embodiments have been enlarged or distorted relative to others to facilitate visualization and clear understanding. In particular, thin features may be thickened, for example, for clarity of illustration.

DETAILED DESCRIPTION OF THE INVENTION

The present invention relates generally to optical components and, more particularly, to a photodetector and photodetector focal plane arrays (FPAs). The present invention also relates to the inclusion of the same in imaging systems such as MWIR and LWIR cameras.

Figure 1:
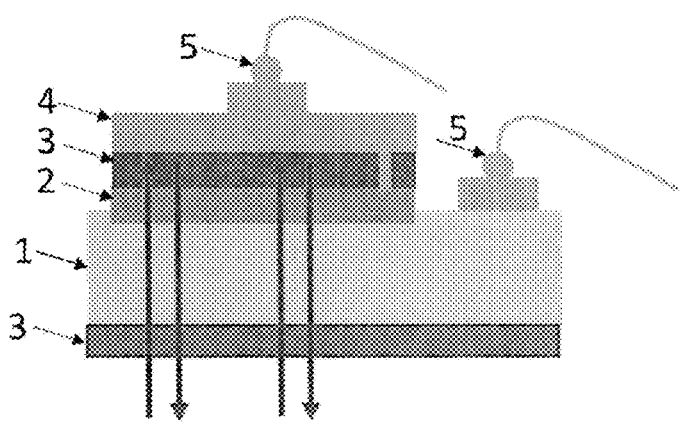
FIG. 1 is a prior art back illuminated metal/silicide Schottky barrier photodetector with anti-reflection coating and a quarter-wave resonant reflector.

FIG. 1 shows a prior art planar back illuminated metal/silicide Schottky barrier photodetector with an anti-reflection coating and a quarter-wave resonant reflector. The planar device structure illustrated in FIG. 1 includes: an Si slab (1); an active layer (2) of the photodetector that is adjacent to a metal/silicide Schottky barrier region; anti-reflection and quarter-wave SiO2 layers (3); a thick metallic back reflector (4); and wire bonds or flip-chip contacts (5).

The active layer (2) of the detector is the region where the electron-hole pairs generated by the incident photons get separated by the built-in electric field of the Schottky barrier. The active layer (2) can be one micron or even several microns thick.

The Schottky barrier is a potential energy barrier for electrons formed at a metal-semi-conductor junction. A Schottky barrier is created at the interface between a metal such as Al, Ni, or Pt and an Si substrate. After annealing, a layer of metal/silicide is formed which can operate either as a mid-wave infrared (MWIR) or short-wave infrared (SWIR) photodetector due to electron-hole pair generation and separation when a reverse bias is applied to the Schottky barrier. In FIG. 1, the metal/silicide region corresponds to the line separating region (2) from region (3) in FIG. 1. The metal/silicide region is typically only several nanometers (e.g., 1-3 nanometers) thick.

There are two main problems with metal/silicide Schottky barrier detectors. The first problem is a concern for all metal/silicide Schottky barrier detectors. As illustrated in FIG. 1, in the case of planar back illuminated photodetectors with an anti-reflection coating and a quarter-wave resonant reflector, the photons at normal incidence intersect the active region (2) of the detector twice, so that the pathlength through active region of the Schottky detectors is rather limited. The specific pathlength depends on the parameters of the system, but it can be assumed that the typical pathlength through the active region (2) will be on the order of one micron. This leads to only a small fraction of the photon flux absorbed in the active region and reduces the quantum efficiency of the detector.

Figure 2:
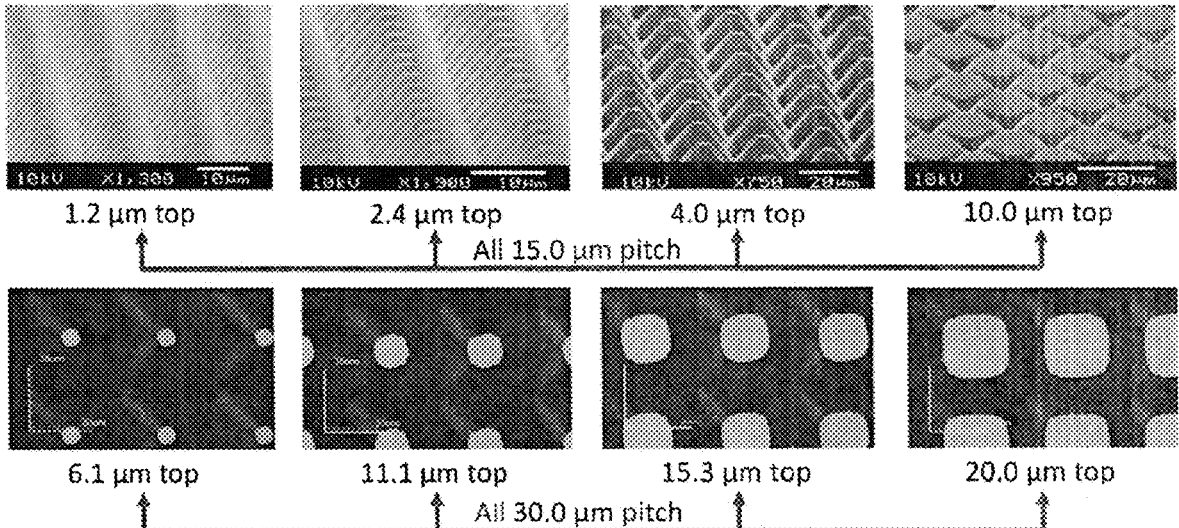
FIG. 2 shows a set of scanning electron microscopy (SEM) images of micropyramidal arrays with various geometrical parameters in the form of pyramids that were fabricated by anisotropic wet etching of Si. The top row are perspective SEM images and the bottom row are top view SEM images.

FIG. 2 shows several Si micropyramidal arrays that have been developed by anisotropic wet etching of Si. The angle of the sidewall surfaces is fixed at 54.7°. This angle is determined by the nature of anisotropic wet etching of Si which exposes planes with a certain crystalline orientation relative to the crystalline orientation of the substrate. Basically, these are planes with the slowest etching velocity. The top row of FIG. 2 shows several examples of micropyramid arrays fabricated with a pitch of 15 μm and a size of their top base varying from 1.2 to 10.0 μm. The bottom row of FIG. 2 shows several examples of truncated micropyramid arrays fabricated with a pitch of 30 μm and a size of their top base varying from 6.1 to 20.0 μm.

The second problem occurs in attempting to use Si micropyramids as tapered dielectric structures. These micropyramids provide multiple reflections by their sidewalls. In this case, light reaches the smaller base of the truncated pyramid where the detector is installed. A part of the light intensity, however, is irreversibly lost in this process due to incomplete reflections by the sidewalls and quantum efficiency of the detector can suffer from these optical losses.

Figure 3A:
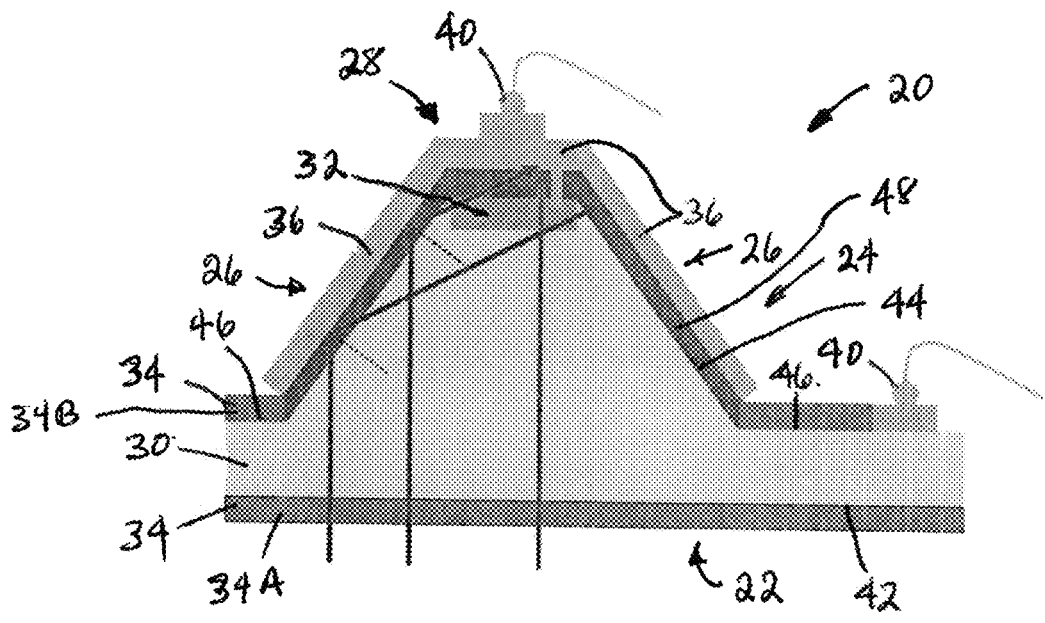
FIG. 3A is a schematic side view of a back illuminated micropyramidal metal/silicide Schottky barrier photodetector with a 3-D mirror according to one embodiment of the present invention that shows part of the ray tracing at normal incidence and the longer pathlength inside the active layer for many rays compared to that in FIG. 1.
Figure 3B:
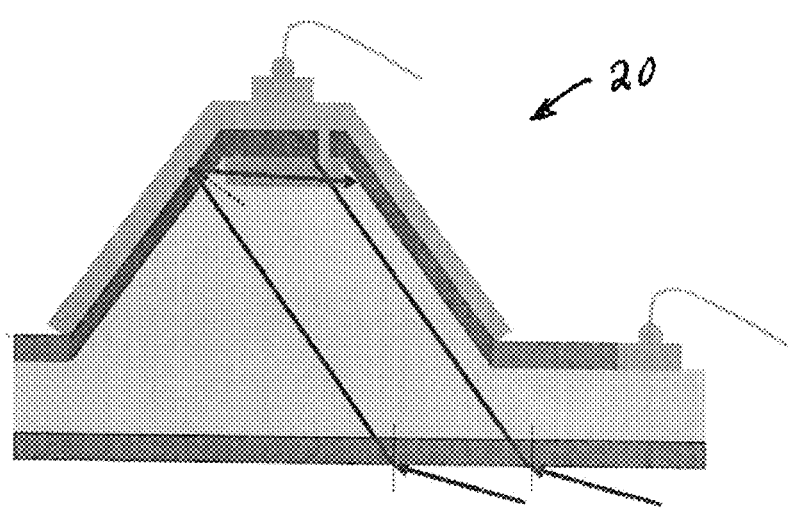
FIG. 3B is the same view of the photodetector shown in FIG. 3A that shows part of the ray tracing at oblique incidence.

FIGS. 3A and 3B show one non-limiting example of the present approach to solving these problems. In FIG. 3A, the photodetector 20 has a first surface (or "larger base") 22, a second surface 24, and sides 26. The first surface 22 is on the bottom in these figures, and the second surface 24 is on the top, although, this structure could be placed in any other orientations. The structure is configured so that the first surface 22 is wider than a portion (a "smaller base") 28 on top of the second surface 24, and the sides 26 are tapered inward from the first surface 22 to the portion 28 on top of the second surface. The structure can have any suitable shape that provides light-concentrating dielectric structures including, but not limited to: different geometrical shapes such as micropyramids, microcones, microspheres, microcubes, microvoids, or other arbitrary shapes. Some other shapes are described in U.S. Pat. Nos. 9,362,324 B1 and 10,585,238 B2, both in the name of Astratov, et al. In the embodiment shown in FIGS. 3A and 3B, the structure is in the configuration of a truncated micropyramid. A plurality of such photodetectors 20 can be arranged into a photodetector focal plane array.

The photodetector 20 shown in FIGS. 3A and 3B comprises: an Si slab 30; an active layer 32 of the photodetector adjacent to a metal/silicide region; a pair of optional anti-reflection and quarter-wave SiO₂ layers 34; metallic reflectors 36 on the small base 28 and sidewall surfaces 26 of the pyramid; and wire bonds or flip-chip contacts 40. The metal/silicide region is distinct from the active layer 32 and corresponds to a line separating active layer 32 from the quarter-wave SiO₂ layer 34 in FIG. 3A. The metal/silicide region and the active layer 32 combine to make up the photodetector region of the photodetector 20.

In contrast to the prior art device shown in FIG. 1, these layers form a 3-D micropyramidal configuration that is determined by the shape of the micropyramid (the Si slab 30) obtained by anisotropic wet etching of Si. More specifically, the Si slab 30 may have a generally planar first side 42 that is closest to the first surface 22 of the photodetector 20. The Si slab 30 has a second side 44 that has a truncated micropyramidal configuration, with the exception of two generally planar side portions 46. One of the generally planar side portions 46 is on the left side of the truncated micropyramid, and the other is on the right side of the truncated micropyramid in FIG. 3A. The slope of the sidewalls 48 of the Si substrate is 54.7°.

It may be possible for the slope of the sidewalls 48 to deviate slightly from the specified slope. For instance, it may be possible for the slope to be within a range that is between about 53.5 and about 56. However, in principle, micropyramids with different angles of the sidewalls can be used for concentrating photons on the detector. The angle of the slope of sidewalls can be controlled by the crystallographic orientation of the wafer (including (001), (110), and (111) orientations), by the orientation of the photomask relative to the crystallographic directions in the plane of the wafer, and by use of additional surfactant at the stage of anisotropic wet etching of Si.

The active layer 32 of the photodetector can comprise different structures or materials that are photosensitive in the IR region of the spectrum (mainly in MWIR or LWIR) such as metal/silicide Schottky barrier detectors in the case of all-silicon structures, mercury cadmium telluride (MTC), photoconductive PbSe, InSb or other semiconductor thin films, quantum dot or superlattice type II detector structures. In the embodiment shown in FIG. 3A, the active layer 32 of the photodetector may be positioned on top of, or embedded into, the small base 28 on top of the truncated pyramid of the Si Slab 30.

The optional anti-reflection and quarter-wave SiO₂ layers 34 can comprise any suitable type of surface dielectric quarter-wavelength layers (such as silica layers in the case of all-silicon FPAs) to provide higher concentration of electromagnetic power on the detectors.

The metallic reflectors 36 can comprise any suitable type of metallic layers that are deposited on the surface of the fabricated microstructures (or on the surface of one of the anti-reflection and quarter-wave SiO₂ layers 34, if present) to provide either plasmonic adiabatic compression/decompression properties to concentrate plasmonic fields towards the detectors, or mirror reflection properties to concentrate electromagnetic fields towards the detectors. Suitable metallic materials include but are not limited to gold. Metallic layers with thicknesses larger than about 100 nm are almost completely reflecting.

In the embodiment shown in FIG. 3A, a first layer of the pair of anti-reflection and quarter-wave SiO₂ layers ("first quarter-wave layer") 34A is joined to the generally planar first side 42 of the Si slab 30. A second layer of the pair of anti-reflection and quarter-wave SiO₂ layers ("second quarter-wave layer") 34B is joined to the second side of the Si slab 30. More specifically, the second quarter-wave layer 34B overlies and is joined to the generally planar side portion 46 on the left side of the truncated micropyramid. It also is joined to the side walls 48 of the Si slab 30, and to the small base 28 on top of the Si slab 30 (which may be defined by the active layer 32). It also overlies and is joined to part of the generally planar side portion 46 of the Si slab 30 on the right side of the truncated micropyramid. The metallic reflectors 36 are disposed over the second anti-reflection and quarter-wave SiO2 layer 34B on the small base 28 and sidewall surfaces 26 of the micropyramid.

FIG. 3A shows part of the ray tracing at normal incidence showing the longer pathlength inside the active layer 32 for several rays compared to that in FIG. 1. FIG. 3B shows part of the ray tracing at oblique incidence showing the longer pathlength inside the active layer for several rays.

Figure 4:
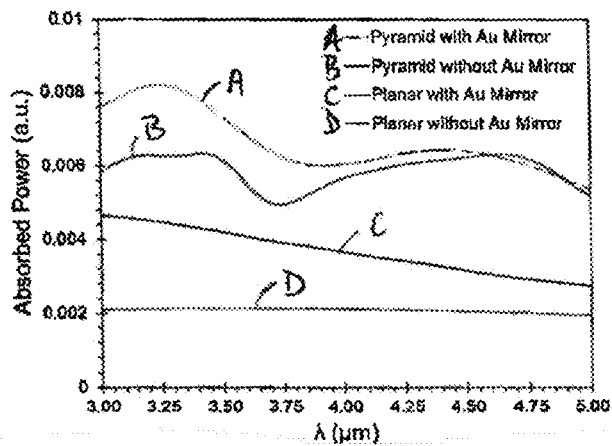
FIG. 4 is a graph that shows the calculated power absorbed by the same weakly absorbing detector used in different structures including prior art planar structure shown in FIG. 1 as well as in the proposed micropyramid shown in FIG. 3A.

FIG. 4 shows the calculated power absorbed by the same weakly absorbing detector used in different structures including prior art planar structure shown in FIG. 1 as well as in the micropyramid shown in FIG. 3A. As a weakly absorbing detector, a 50 nm thick InSb layer with a width of 3.5 μm is selected and the power absorbed in this layer is calculated once it is deposited on the Si surface in two cases, with and without mirror, for both structures shown in FIG. 1 and FIG. 3A. For the structure shown in FIG. 3A, the 15 μm larger base and 4 μm smaller base was selected. The modeling results in FIG. 4 illustrate that a larger fraction of the power is absorbed in the same size detector for the proposed structure with the mirror deposited on the side walls (or "sides") 26 and small base 28 of the truncated pyramid (curve A) compared to other device configurations (curves B, C, and D).

The approach used in the photodetector of the present invention is based on two principles. The first is to dramatically increase the pathlength of light in the active region of the detector and, thus, increase the probability of absorption. The second is to eliminate the loss of light upon reflections by the sidewalls 26. In order to achieve both goals at the same time a 3-D mirror is created on a sidewall 26 surfaces of the micropyramid, as is schematically illustrated in FIGS. 3A and 3B. Without wishing to be bound to any particular theory, it is believed that the 3-D mirror traps photons in the photodetector region and, thus, increases the photon pathlength and probability of absorption in the active detector region. Due to the 3-D nature of such a mirror, it tends to trap photons incident from different directions. For this reason, the proposed devices have a large angle of view.

The large increase in the pathlength of IR radiation inside the micropyramids also increases the quantum yield and detection capability of a photodetector integrated with each pyramid. This also allows the size of the photodetector region located close to the smaller base 28 of the micropyramid to be reduced in order to reduce its thermal current noise which is proportional to the root of the photodetector area.

Figure 5:
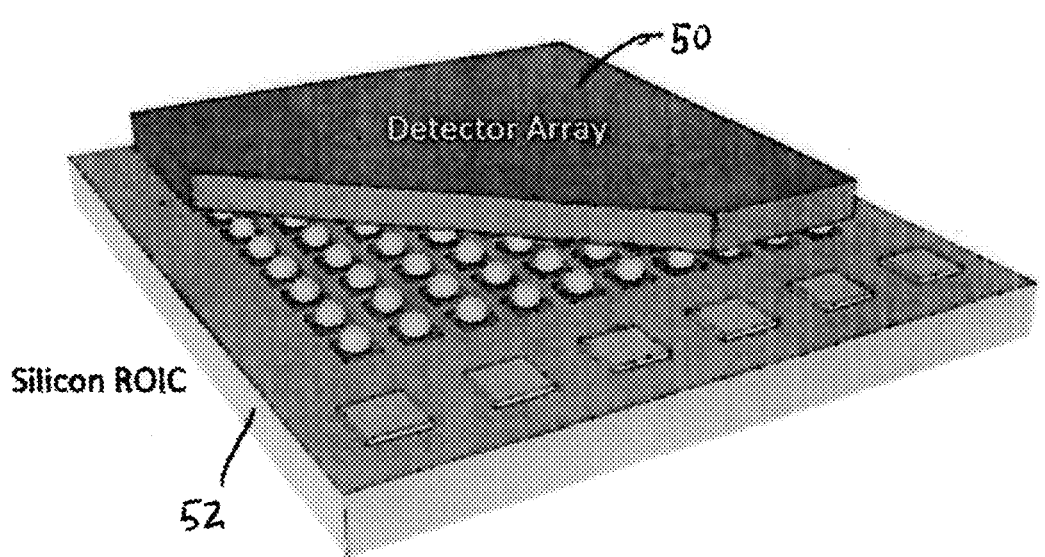
FIG. 5 is a schematic perspective view of a focal plane array (FPA) comprising an Si ROIC integrated with a detector array.

FIG. 5 shows that the photodetector array 50 can be joined to a Read-Out Integrated Circuit (ROIC) 52 to form a focal plane array (FPA). More specifically, the readout integrated circuit (ROIC) 52 is electrically connected to the individual photodetectors to provide a pixel-by-pixel image acquisition. This focal plane array (FPA) with enhanced detection capability and reduced thermal current can be used for infrared (IR) imaging applications in mid-wave IR (MWIR) and long-wave IR (LWIR) cameras as night vision and thermal imaging devices.

The increased absorption probability for photons (and, consequently, higher photo response) provides the photodetectors with compact size (and, hence, with the limited level of thermal noise). The higher signal-to-noise ratio for MWIR and LWIR photodetector FPAs provides the possibility of increasing their operation temperature.

There are numerous, non-limiting embodiments of the invention. All embodiments, even if they are only described as being "embodiments" of the invention, are intended to be non-limiting (that is, there may be other embodiments in addition to these), unless they are expressly described as limiting the scope of the invention. Any of the embodiments described herein can also be combined with any other embodiments in any manner to form still other embodiments.

Figure 6:
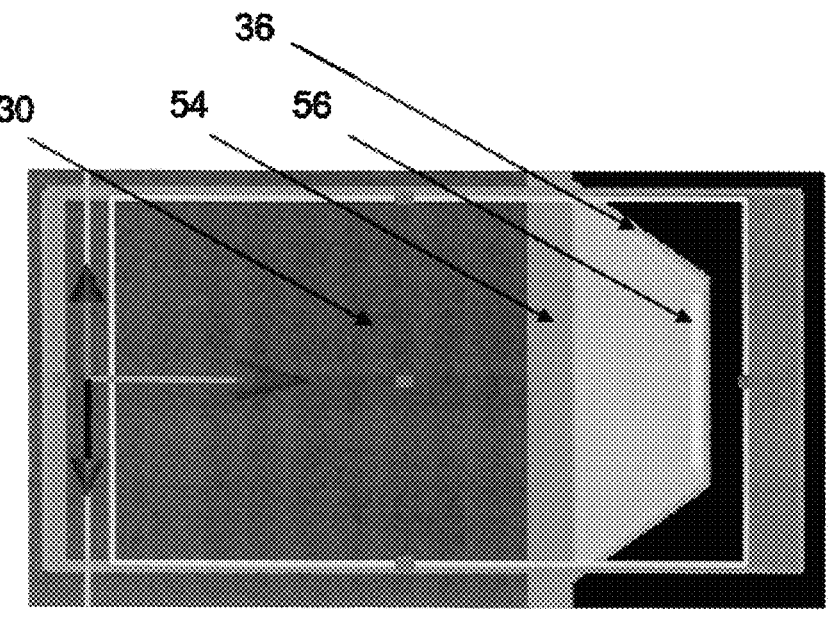
FIG. 6 is a schematic side view rotated 90 degrees clockwise of an alternative embodiment of a back illuminated micropyramidal metal/silicide Schottky barrier photodetector with a 3-D mirror and an additional SiO₂ layer at the wider base of the Si pyramid.
Figure 7:
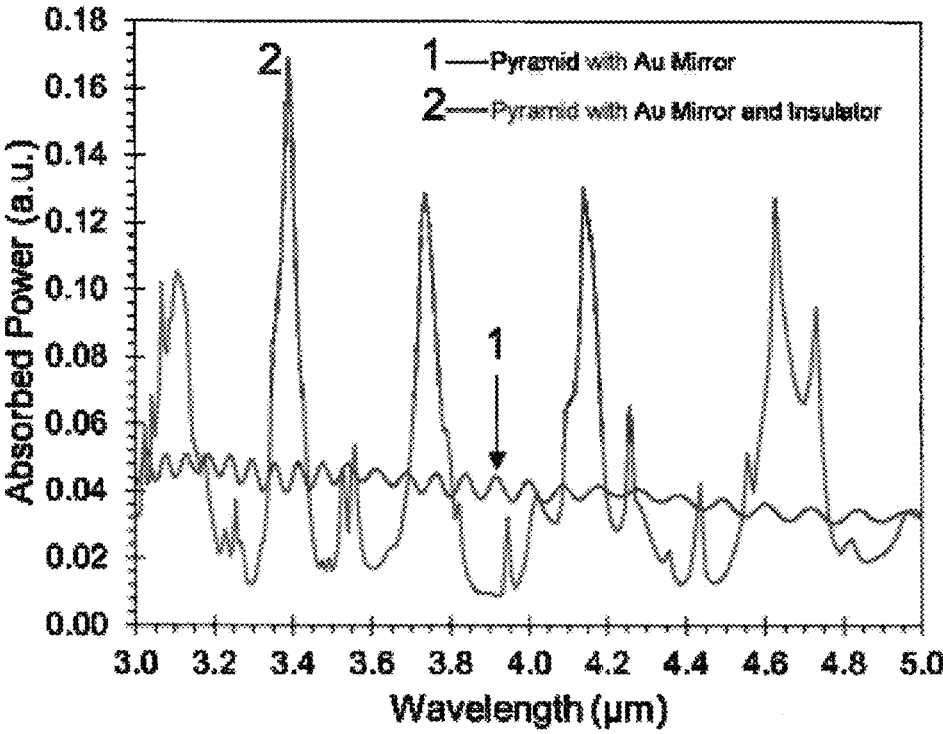
FIG. 7 is a graph of the absorbed power of micropyramidal arrays with and without an SiO₂ layer.

FIG. 6 shows one alternative embodiment. In the embodiment illustrated in FIG. 6, an additional $SiO_2$ layer (or "oxide layer") 54 is added at the wider base of the Si pyramid. This layer provides a reflection for photons which can create a strong resonance for the optical power inside the pyramid. This is because the index of oxide (n=1.4) is much smaller than the index of Si (n=3.5). For pyramids with relatively small height, the reflection at the interface with the oxide layer along with the reflection at the small base of the pyramid creates a Fabry-Perot resonator with the plane-parallel mirrors. This leads to formation of strong peaks of the absorbed power which can be detected by the weakly absorbing monitor (active layer) 56, as illustrated in FIG. 7 for an Si pyramid with a 15 μm large base and an 8 μm small base. The thickness of the $SiO_2$ layer is 2 m. Both cases with and without oxide layer 54 were modeled using a simplified 2-D model, and are compared in FIG. 7. It is seen that adding the oxide layer 54 allowed to resonantly enhance the peak value of absorption by more than three times. This result obtained in a simplified two-dimensional (2-D) case means that about an order of magnitude enhancement of absorption can be expected in the 3-D case. For pyramids with increased height which have a more compact small base, the reflections by the tilted sidewalls play a larger role due to changing the propagation direction inside the pyramid, but in any case, strong resonant peaks of the absorbed power are expected. The micropyramidal arrays with an $SiO_2$ layer 54 can be fabricated by anisotropic wet etching of the silicon-on-insulator (SOI) structures.

The proposed devices have multiple embodiments where instead of metal/silicide Schottky barrier detectors, other types of detectors can be used. In these cases, the active layer 32 in FIG. 3A is represented by these other types of detectors. The examples include deposition of PbSe or other semiconductor layers with sufficiently strong absorption properties in MWIR or LWIR regimes. In contrast to proposed photovoltaic detectors, these semiconductor layers can operate as photoresistor detectors with or without photoelectric gain. In principle, these embodiments can provide even more advantages for sensitive detection with low thermal noise because of their potentially stronger absorption properties.

The devices described herein can be made in any suitable manner. Several examples of methods of making the devices are described in the Examples below.

A method is also provided for concentrating IR radiation in a dielectric structure. The method may utilize a photodetector focal plane array (FPA) that comprises any of the light-concentrating dielectric structures described herein. The method comprises: providing a photodetector 20 comprising a tapered dielectric structure with a larger base, side walls 26 and a smaller base 28, wherein an active layer 32 of the photodetector is provided at the smaller base 28, and the side walls 26 and the smaller base 28 are mirrored to reflect at least some of the IR radiation into the interior of the structure; and directing radiation into the interior of the tapered structure wherein at least some of the radiation reflects off at least one of the surfaces of the tapered side walls 26 and then passes through the active layer of the photodetector. The method may increase the pathlength through the active layer and, hence, absorption and quantum yield of the dielectric structure.

The devices described herein can provide a number of advantages. It should be understood, however, that these advantages need not be required unless they are set forth in the appended claims.

This invention may simultaneously utilize three factors improving signal-to-noise ratio in MWIR and LWIR photodetector FPAs. These factors are: a) increased photon collection efficiency due to catching incident photons by the larger base of the Si pyramid, b) increased photon path length inside the active region of the photodetector which enhances the probability of absorption for photons and quantum yield of the device, and c) decreased photodetector area which helps to reduce the thermal current noise of the proposed devices. This is believed to dramatically improve the quality of imaging in compact and lightweight thermo-electrically cooled MWIR and LWIR cameras. Other advantages are described above and in the examples below.

The term "joined", as used herein, encompasses configurations in which an element is directly secured to another element by affixing the element directly to the other element and/or by forming or depositing the element on the surface of the other element; configurations in which the element is indirectly secured to the other element by affixing the element to intermediate member(s) which in turn are affixed to the other element; and configurations in which one element is integral with another element, i.e., one element is essentially part of the other element.

The terms "up", "down", "left", and "right" are only made in conjunction with the drawing figures, and the photodetector may be oriented differently in use.

The following examples illustrate particular properties and advantages of some of the embodiments of the present invention. Furthermore, these are examples should not be construed as in any way limiting the scope of the invention.

Examples

The primary goals of these examples are to fabricate truncated Si micropyramidal arrays, integrate them with platinum/silicide (PtSi) Schottky barrier photodetectors, and to optically test the fabricated devices in comparison with the reference planar photodetectors of the same size in order to compare the signal enhancement gained from the micropyramid designs. The quantum efficiency (QE) of conventional planar Si based photodetectors is limited because of Si's indirect band gap, which results in low absorption and collection of photocarriers. Due to light-concentrating capability of Si micropyramids, after integration with the detectors, the photodetectors have a high potential for increased absorption and, hence, enhanced QE and photoresponse.

An additional advantage is related to the fact that the size of the photodetector mesa located near the top of the truncated micropyramid can be reduced in comparison with the standard planar devices, which can result in decreased thermal noise of the proposed devices and, potentially, increase their operation temperature.

A Schottky barrier is created at the interface between a metal such as Al, Ni, or Pt and an Si substrate. After annealing, a layer of metal/silicide is formed which can operate either as a mid-wave infrared (MWIR) or short-wave infrared (SWIR) photodetector due to electron-hole pair generation and separation when a reverse bias is applied to the Schottky barrier. Recently, the ability to quickly fabricate Si micropyramidal arrays via low-cost anisotropic wet etching techniques has enabled the straightforward integration of Si micropyramidal arrays with photodetectors through either monolithic or heterogenous means.

In the examples described herein, suitably large micropyramids with their truncated tops are optically coupled to photodetectors. The truncated micropyramids employ an optical function similar to that of "tapered" waveguides or, alternatively, mirror light concentrators in solar cells. These mirror-type structures, however, are much easier to make in comparison to prior nanoplasmonic adiabatic concentrators since the current structures require only a micron-scale fabrication accuracy that is achievable by standard photolithographic methods. Since the goal is to study the signal enhancement of such structures instead of building a fully-functioning camera, Pt is deposited on the tops of individual micropyramids and 100 PtSi Schottky barrier photodetectors are combined electrically in parallel to simplify their characterization. The initial results indicate that 22 μm square photodetectors monolithically integrated with micropyramidal arrays provide a response that is several times stronger compared to the flat reference mesa with the same size, as is explained below.

In order to test the effect of the three-dimensional (3-D) light-concentrating micropyramids have on the photoresponse and signal enhancement of the Schottky barrier photodetectors, their photoresponse is compared with a conventional planar detector of the same size. To this end, 10×10 micropyramidal arrays with 54.7° sidewall angles, 60

μm pitch, 28 μm top size, and 22.6 μm height are fabricated on a double-side polished (100) p-type Si wafer with resistivity from 1-10 ohm-cm and 100 nm thermal silica on both sides fabricated by an anisotropic wet etching technique.

Afterwards, 22 μm square PtSi Schottky barrier photodetectors are fabricated directly on the tops of these micropyramids, as well as on flat regions undisturbed by the micropyramid etching process for direct comparisons on the same sample. These fabrication steps are shown in FIGS. 8A to 8L. The mesa size is smaller than the micropyramid top size to account for minor misalignment, as well as corner undercutting of the micropyramid tops, displayed in FIG. 8A.

Figures 8A, 8B:
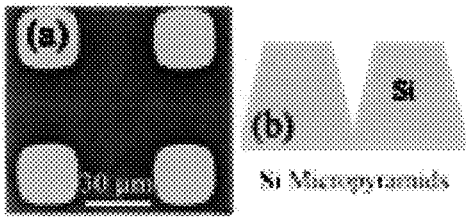
FIG. 8A is a microscope photograph showing a first step in the fabrication of the PtSi Schottky photodetector arrays from the top.
FIG. 8B is a schematic side view showing the first step in the fabrication of the PtSi Schottky photodetector arrays.
Figures 8C, 8D:
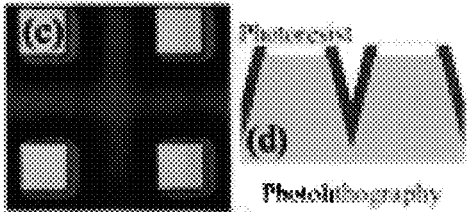
FIG. 8C is a microscope photograph showing a second step in the fabrication of the PtSi Schottky photodetector arrays from the top.
FIG. 8D is a schematic side view showing the second step in the fabrication of the PtSi Schottky photodetector arrays.
Figures 8E, 8F:
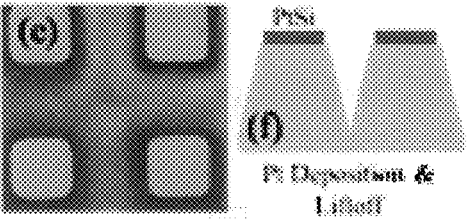
FIG. 8E is a microscope photograph showing a third step in the fabrication of the PtSi Schottky photodetector arrays from the top.
FIG. 8F is a schematic side view showing the third step in the fabrication of the PtSi Schottky photodetector arrays.
Figures 8G, 8H:
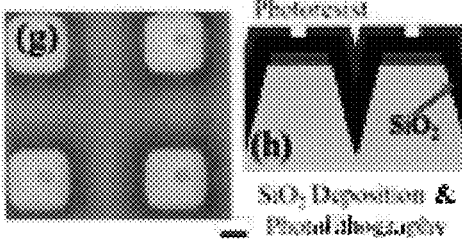
FIG. 8G is a microscope photograph showing a fourth step in the fabrication of the PtSi Schottky photodetector arrays from the top.
FIG. 8H is a schematic side view showing the fourth step in the fabrication of the PtSi Schottky photodetector arrays.

In order to first create the photodetector mesas, photolithography is necessary to create the photoresist pattern as shown in FIGS. 8C and 8D. The sample is cleaned with solvent and AZ15nXT photoresist is spin coated to achieve a thickness of ~5.5 μm, which is necessary to completely cover the micropyramid sidewalls. The sample is then exposed with a Heidelberg DWL 66+ laser writer to achieve the final pattern. Afterwards, the sample is dipped in 7:1 buffered oxide etchant (BOE) to remove any native silicon dioxide ($SiO_2$) that may have formed, and then 1 nm of Pt is deposited with an electron beam (e-beam) evaporator. The photoresist is then removed to reveal the PtSi photodetector mesas, as shown in FIGS. 8E and 8F. No annealing is necessary for realizing the Schottky barrier photodetector properties due to the high deposition temperature as well as the thinness of the Pt layer.

The next step is to passivate the sample in order to isolate the photodetectors. Two hundred nm of $SiO_2$ is deposited through plasma-enhanced chemical vapor deposition (PECVD), then ~6.2 μm thick AZP4620 photoresist is spin coated and exposed to reveal the result shown in FIGS. 8G and 8H. Afterwards, the sample is placed in a 7:1 BOE bath to create a small 5 μm wide hole through the $SiO_2$ layer above the PtSi photodetectors, and the photoresist is removed such that the sample is ready for metal deposition, as shown in FIGS. 8I and 8J.

The final fabrication step is to deposit metal to create electrical contacts for testing, as well as to combine all 100 individual photodetectors together in parallel to simplify characterization. Similar photolithography steps are utilized with AZ15nXT photoresist. Afterwards, 5 nm of chromium (Cr) and 300 nm of gold (Au) is deposited with an e-beam evaporator to create the n-contact on the PtSi layer, as well as the p-contact on the doped Si as shown in FIGS. 8K and 8L. The photoresist is then removed, and the sample is epoxied to the chip carrier such that the center four photodetectors can be back-side illuminated for device characterization.

Device Characterization and Analysis

Light-concentrating truncated Si micropyramidal arrays with 54.7° sidewall angles are successfully integrated with PtSi Schottky barrier photodetectors. Four different devices consisting of 10×10 photodetectors with 60 μm pitch combined in parallel are tested with: (i) planar 57 μm square mesas, (ii) planar 22 μm square mesas, and (iii) 22 μm square mesas on top of truncated micropyramids (two samples A and B were tested). The representative sample A has 10×10 micropyramids. The PtSi Schottky barrier photodetectors are illuminated through the substrate's polished back surface, where light propagated through the substrate towards the photodetectors fabricated on the front surface. For the devices with micropyramids, light is propagated through the polished back surface, through the wafer, and then is concentrated towards the tops of the micropyramids where photons are partially absorbed in the PtSi region. The photoresponse data are measured with a Bruker V80 FTIR spectrometer in combination with a Keithley 428 current pre-amplifier by illuminating the device inside the 80K $LN_2$ dewar fitted with a germanium (Ge) window to minimize any ambient signal. The QE data are measured by changing the illumination source to a 500° C. blackbody cavity, and implementing a chopper with a lock-in amplifier fixed at the chopper's frequency.

Figure 9:
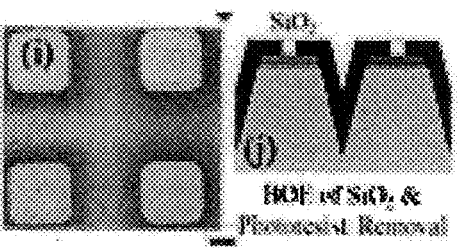
FIG. 9 is a graph of the photoresponse of four devices including two planar photodetectors and two micropyramidal photodetectors.
Figure 9:
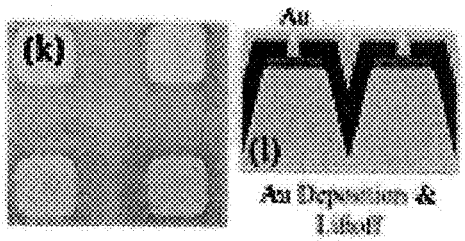
Figure 9:
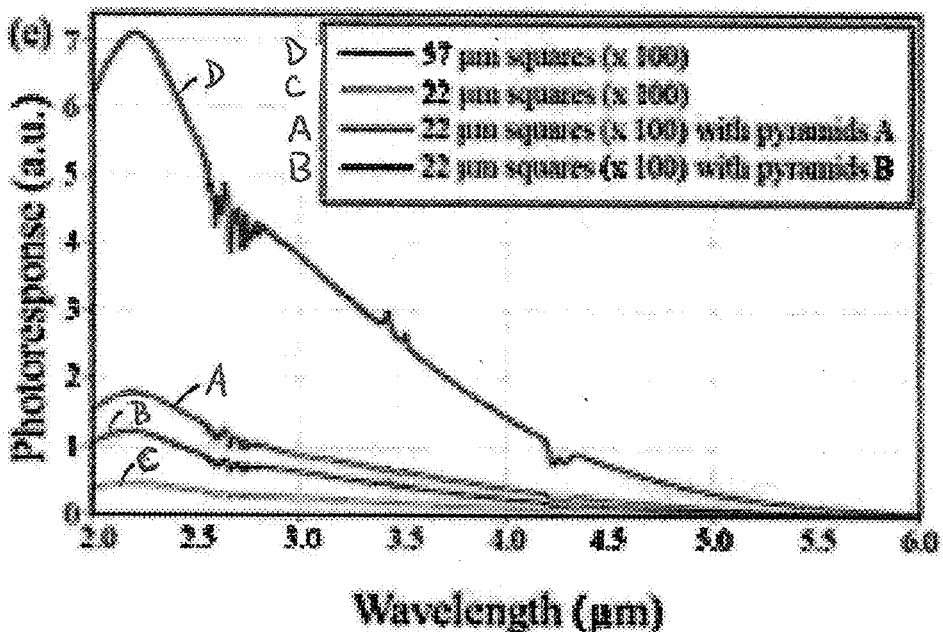
Figure 10:
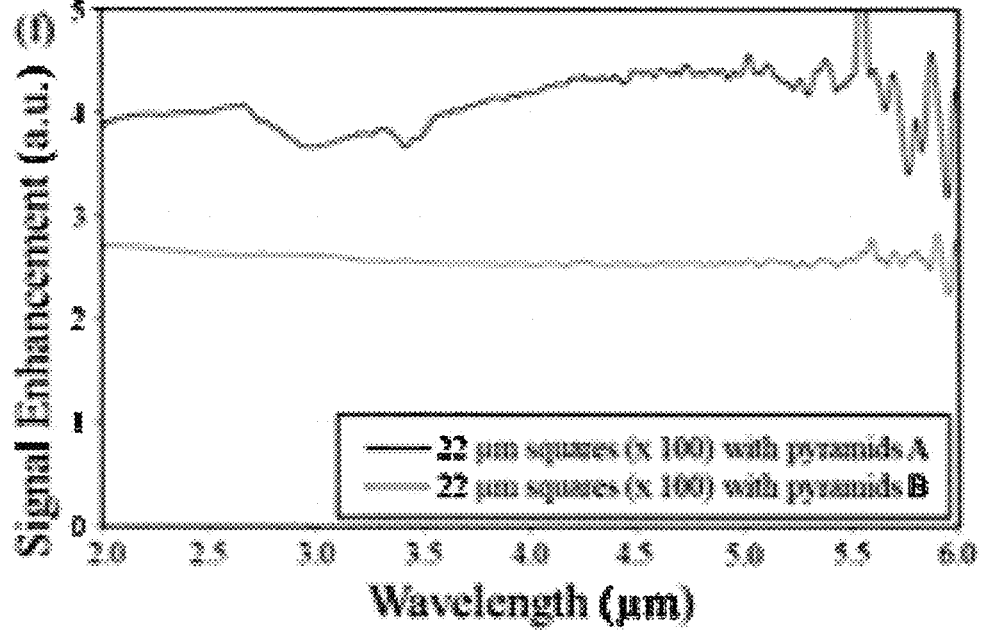
FIG. 10 is a graph of the signal enhancement provided by the two micropyramidal photodetectors.

These two measurement techniques, QE and spectral photoresponse, allow for direct comparisons between the four devices. By measuring the photoresponse, the photodetector's spectral sensitivity between 2-6 μm is determined, but the comparison of photocurrents produced by different devices was made difficult because of the not completely reproducible illumination conditions in the setup. On the other hand, by measuring the QE, the photoresponse scaling factor for each device is determined because the incident flux of photons is carefully taken into account, and the devices can be directly compared. An example of such comparison for different structures is illustrated in FIG. 9. On the other hand, the signal enhancement is calculated by dividing the scaled photoresponse from the micropyramidal photodetector arrays by the photoresponse from the conventional planar photodetector arrays of the same size. These results are shown in FIG. 10.

The results of the photoresponse (FIG. 9) and signal enhancement plots (FIG. 10) experimentally demonstrate that the micropyramids function as light concentrators, and can improve the detected signal. The photoresponse plot in FIG. 9 shows that the conventional planar 57 μm square photodetector device has the largest photoresponse, however, it is supposed to come with the largest thermal current noise determined by the largest area of this detector. The fact that all 22 μm square photodetector arrays show smaller photoresponse is expected in all cases since even in the case of using micropyramids the efficiency of collection photons by the large pyramid's base towards its smaller base where the photodetector is located is still smaller than 100%. The main result of this comparison, however, is the fact that the two 22 μm square photodetector micropyramidal devices (A and B) outperformed the conventional planar geometry photodetectors with the same size. All these 22 μm devices are expected to have a thermal noise reduced by the 22/57 factor compared to the largest 57 μm square detector.

The most important result is that although the photon collection efficiency of the micropyramids with 60 μm large base size was found to be imperfect because of the optical losses inside the micropyramid, the optical signal detected at the smaller base was still significantly higher than that for the conventional planar 22 μm square photodetector device. This suggests that although a fraction of the total power incident on the large base escaped from the micropyramids, either through sidewall leakage or due to reflection in a backward direction, still a significant fraction of the total power incident on the larger base was delivered to smaller base with the photodetector. Comparison with the same size (22 μm) planar photodetector in FIG. 9 shows that the micropyramids provide, on average, ~2.6× signal enhancement for sample B and ~4.1× enhancement for sample A.

CONCLUSION

The potential advantages of the Si-based micropyramidal arrays integrated with photodetectors compared to standard planar FPAs are many-fold:

They allow for a reduction in the size of the photodetector mesa while still retaining significant photoresponse.

Reduction of the mesa size means that the thermal current noise can be reduced and operational temperature of the device can be increased.

In the fabricated structures a significant fraction (~25%) of the electromagnetic (EM) power incident on the larger base is delivered to the smaller base coupled to the photodetector, but the rest of the power is lost. Despite this loss, the delivered power is at least 2.6 times larger than the signal measured by the same size (22 μm) detector operating without micropyramid.

Micropyramids are capable of trapping light resonantly inside the active region of the photodetector, thus increasing the pathlength for the photons, the probability of their absorption, and the QE of the photodetectors, thus solving a major underlying problem of Si-based photodetector FPAs with significant application in uncooled MWIR cameras and thermal sensor devices.

The disclosure of all patents, patent applications (and any patents which issue thereon, as well as any corresponding published foreign patent applications), and publications mentioned throughout this description are hereby incorporated by reference herein. It is expressly not admitted, however, that any of the documents incorporated by reference herein teach or disclose the present invention.

It should be understood that every maximum numerical limitation given throughout this specification includes every lower numerical limitation, as if such lower numerical limitations were expressly written herein. Every minimum numerical limitation given throughout this specification includes every higher numerical limitation, as if such higher numerical limitations were expressly written herein. Every numerical range given throughout this specification includes every narrower numerical range that falls within such broader numerical range, as if such narrower numerical ranges were all expressly written herein.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A photodetector focal plane array (FPA) comprising:
   a) photodetectors that are photosensitive in the IR region of the electromagnetic spectrum;
   b) light-concentrating dielectric structures in a form of arrays comprising elements with three-dimensional geometrical shapes, wherein the elements have a first surface, a second surface, and tapered sidewalls that taper inwardly to a portion of said second surface that has a reduced width, wherein a detector is joined to the portion that has a reduced width; and
   c) a metallic layer that is disposed over the tapered sidewalls of the elements and the portion of the surface of the elements that has a reduced width and the detector, wherein the metallic layer provides mirror reflection properties to concentrate electromagnetic fields towards the detectors.

2. The photodetector focal plane array (FPA) of claim 1 wherein the photodetector is photosensitive in at least one of the MWIR or LWIR regions of the electromagnetic spectrum.

3. The photodetector focal plane array (FPA) of claim 1 wherein the detector is selected from the group consisting of: metal/silicide Schottky barrier photodetectors in the case of all-silicon structures, photoconductive mercury cadmium telluride (MTC), PbSe, InSb or other semiconductor thin films, quantum dot or superlattice type II detector structures.

4. The photodetector focal plane array (FPA) of claim 1 wherein the elements with three-dimensional geometrical shapes are selected from the group consisting of: micropyramids, microcones, microspheres, microcubes, or microvoids.

5. The photodetector focal plane array (FPA) of claim 1 wherein the elements with three-dimensional geometrical shapes are integrated with wafers containing layers with different index of refraction such for example as silicon-on-insulator (SOI) to provide additional resonant enhancement of the power absorbed by the detectors.

6. The photodetector focal plane array (FPA) of claim 1 further comprising:

d) surface dielectric quarter-wavelength layers, wherein a first surface dielectric quarter-wavelength layer is disposed over the first surface of the elements, and a second surface dielectric quarter-wavelength layer is disposed over the second surface of the elements, wherein said second surface dielectric quarter-wavelength layer is positioned between the metallic layer and the second surface of the elements.

7. The photodetector focal plane array (FPA) of claim 6 wherein the surface dielectric quarter-wavelength layers comprise silica layers.

8. An imaging system comprising the photodetector focal plane array (FPA) of claim 1 that further comprises a readout integrated circuit (ROIC) electrically connected to individual photodetectors to provide a pixel-by-pixel image acquisition.

9. A method for concentrating IR radiation in a dielectric structure, said method comprising:

1) providing a photodetector focal plane array (FPA) comprising:

a) photodetectors that are photosensitive in the IR region of the electromagnetic spectrum;

b) light-concentrating dielectric structures in a form of arrays comprising elements with three-dimensional geometrical shapes, wherein the elements have a first surface, a second surface, and tapered sidewalls that taper inwardly to a portion of said second surface that has a reduced width, wherein a photodetector is joined to the portion that has a reduced width; and c) a metallic layer that is disposed over the tapered sidewalls of the elements and the portion of the surface of the elements that has a reduced width, wherein the metallic layer provides mirror reflection properties to concentrate electromagnetic fields towards the detectors; and 2) directing radiation into the interior of the tapered structure wherein at least some of the radiation reflects off at least one of the surfaces of the tapered side walls toward another surface of the tapered side walls.

\* \* \* \* \*